United States Patent [19]
Rohde et al.

[11] Patent Number: 5,798,485
[45] Date of Patent: Aug. 25, 1998

[54] CABINET FOR HOUSING ELECTRONIC EQUIPMENT

[75] Inventors: Sheldon L. Rohde, Allen; Rodney Barclay, Richardson; Mark L. Slotterback, Frisco; Brian S. Spate, Dallas; Richard K. Fultz, Carrollton; C. Gordon Harrison, Plano; Douglas N. Laube, Nevada, all of Tex.

[73] Assignee: DSC Telecom L.P., Plano, Tex.

[21] Appl. No.: 777,852

[22] Filed: Dec. 31, 1996

[51] Int. Cl.$^6$ .................................................. H05K 9/00
[52] U.S. Cl. .................... 174/35 R; 174/52.1; 361/724; 361/727; 312/223.2
[58] Field of Search ................................. 361/724, 725, 361/727, 816, 818; 174/65 R, 50, 60, 35 R, 52.1; 312/223.2, 223.1, 223.6, 223.3, 198, 348.3

[56] References Cited

U.S. PATENT DOCUMENTS 5,536,079  7/1996  Kostic .......................... 312/265.3
5,574,251 11/1996  Sevier .............................. 174/50

Primary Examiner—Kristine L. Kincaid
Assistant Examiner—Hung V. Ngo
Attorney, Agent, or Firm—Baker & Botts, L.L.P.

[57] ABSTRACT

A cabinet (10) for housing electronic equipment includes a first vertical frame member (12) and a second vertical frame member (14) connected to an upper horizontal frame member (16), a lower horizontal frame member (18), and an intermediate horizontal frame member (20). The upper horizontal frame member (16) includes input/output ports (26) for receiving external cables for passing telecommunications signals. The upper horizontal frame member (16) also includes a recess to slidably receive an air filter assembly. The lower horizontal frame member (18) has reinforced joints for seismic protection. The intermediate horizontal frame member (20) includes integrated ports (40) for internal cable routing and a similar recess (42) for slidably receiving an air filter assembly. A cable tube (24) is connected to the first vertical frame member (12) and the second vertical frame member (14). The cable tube (24) provides cable access to and between the intermediate horizontal frame member (20) and adjacent cabinets while maintaining cable shielding integrity.

8 Claims, 10 Drawing Sheets

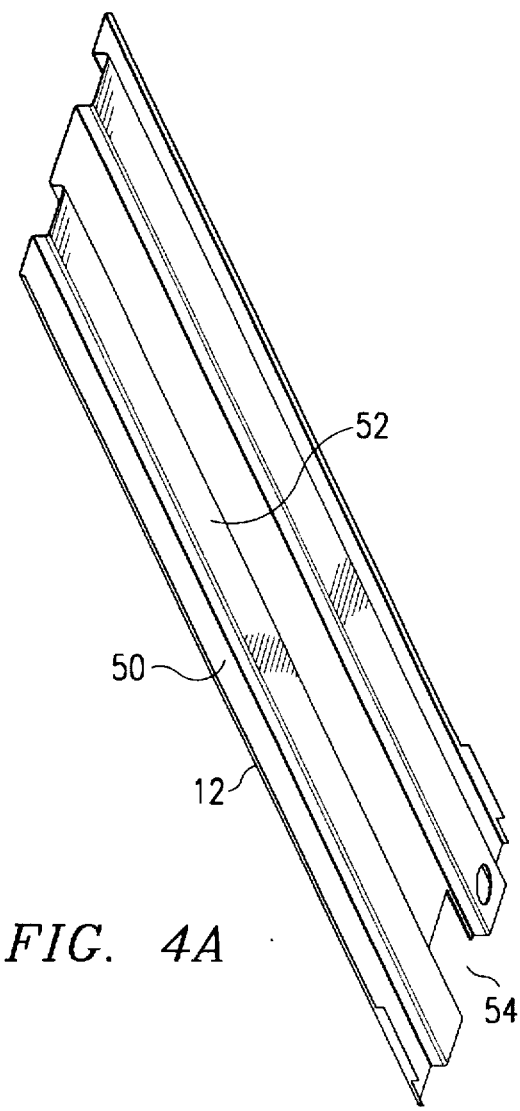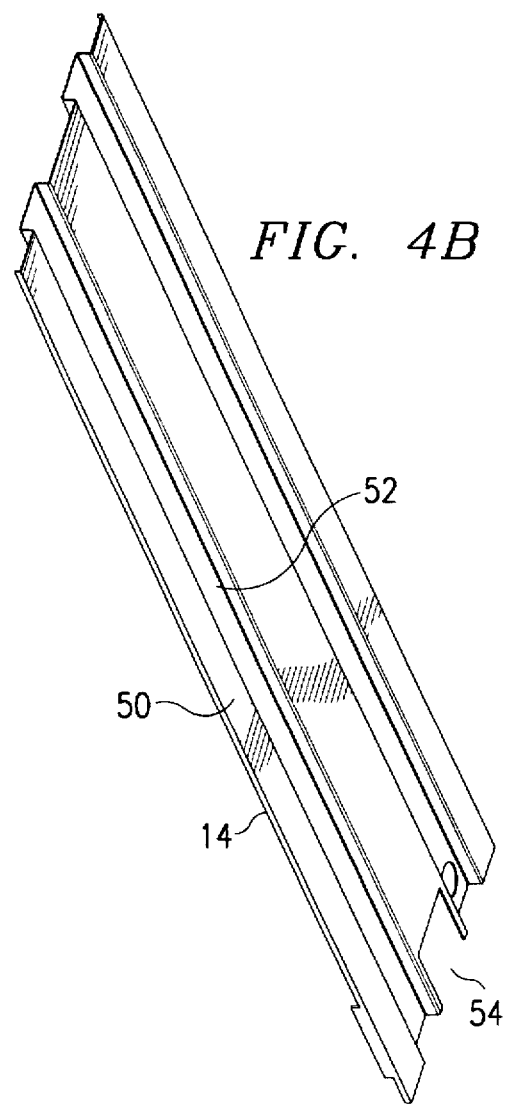

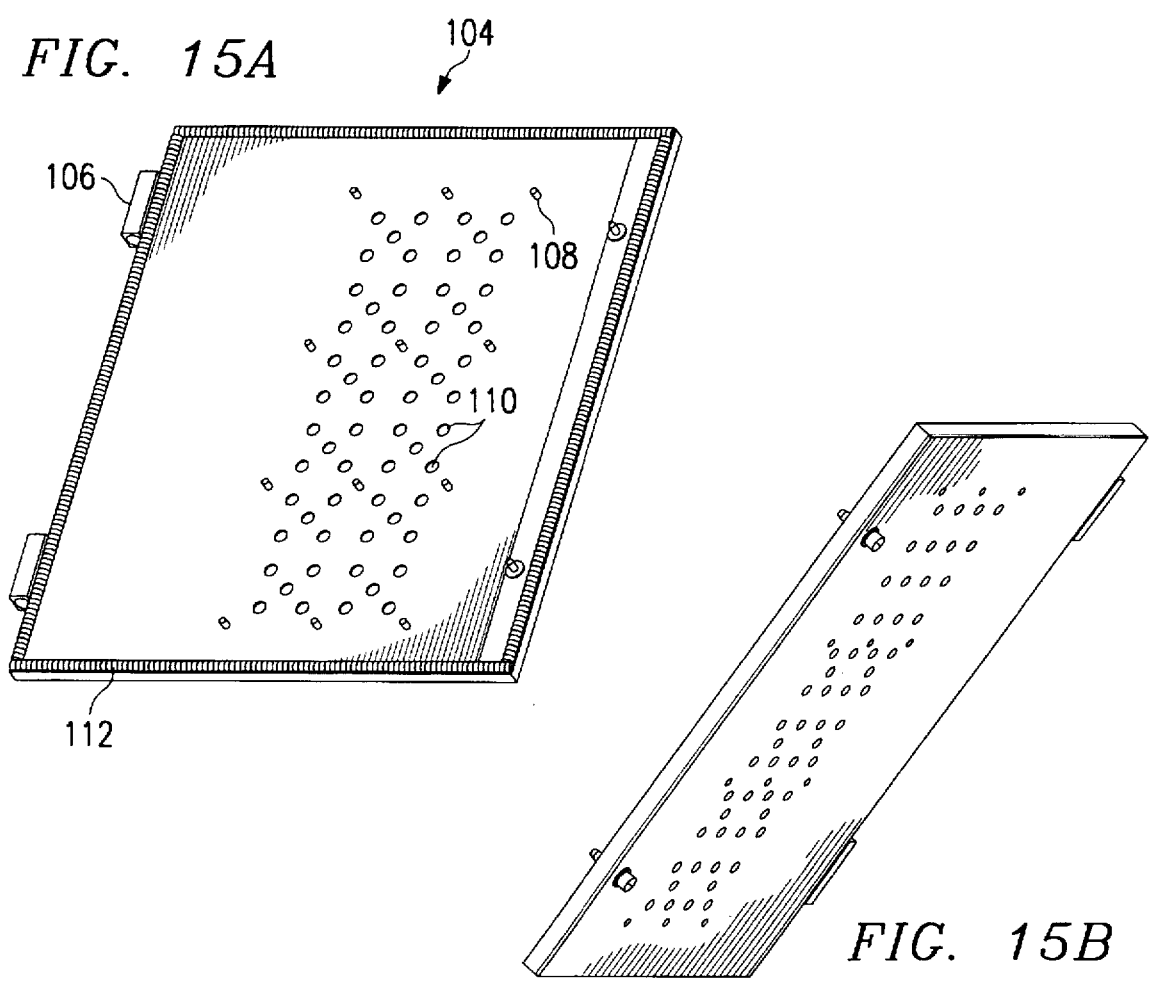
FIG. 15A
FIG. 15B
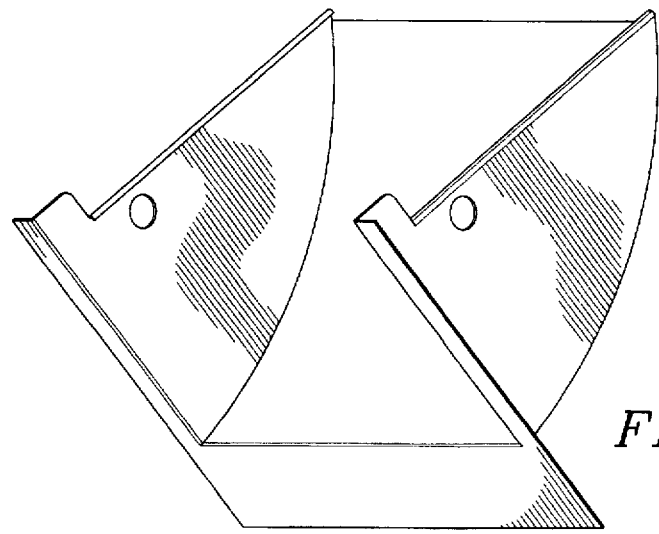
FIG. 16

1

CABINET FOR HOUSING ELECTRONIC EQUIPMENT

TECHNICAL FIELD OF THE INVENTION

The present invention relates to telecommunications enclosures and more particularly to a cabinet for housing electronic equipment.

BACKGROUND OF THE INVENTION

The telecommunications industry has established stringent requirements for electronic equipment cabinets. These cabinets are intended to house various types of telecommunications equipment, including active electronic and optical systems and passive mechanical cross-connect and splicing fields. The cabinets are required to protect the electronics equipment from a wide range of ambient temperatures and inclement climatic conditions including rain, snow, sleet, high winds, wind driven rain, ice, and sand storms. These cabinets must pass stringent weathertightness rain intrusion, wind driven rain intrusion, salt fog spray, temperature cycling, and high humidity tests.

In addition to weathertightness, the cabinet must also provide electromagnetic field interference (EMI) shielding to meet the Federal Communications Commission (FCC) electromagnetic emission and immunity criteria. If not properly shielded, the electronic equipment may emit signals that interfere with the operation of unrelated equipment. Proper shielding also prevents radio frequency signals from sources outside of the cabinet from adversely interfering with the operations of the digital telecommunications system in the cabinet.

The stringent requirements set forth by the telecommunications industry may also require the cabinets to be transportable with the equipment installed therein. Previously constructed cabinets do not provide adequate support for the contents while it is being transported. Several requirements documents may be consulted for a detailed description of the requirements and the test criteria for telecommunications enclosures.

Accordingly, a need has arisen for a cabinet to house electronic equipment that meets the weathertightness, electromagnetic interference shielding, and transportability requirements as set forth above. To satisfy these requirements, the cabinet structure, door, and door mating surfaces are specially designed to provide structural integrity and shielding from the weather and electromagnetic interference.

SUMMARY OF THE INVENTION

In accordance with the present invention, a cabinet for housing electronic equipment is provided that substantially eliminates or reduces disadvantages and problems associated with conventional telecommunications enclosure designs.

According to an embodiment of the present invention, there is provided a cabinet for housing electronic equipment that includes upper and lower horizontal frame members connected to two vertical frame members. The upper horizontal frame member includes input and output ports to provide external connections to cables. The upper horizontal frame member includes a recess to slidably receive an air filter. The lower horizontal frame member includes reinforced joints to provide seismic protection. An intermediate horizontal frame member connects to the two vertical frame members and includes integrated ports to provide internal cable routing. The intermediate horizontal frame member includes a recess to slidably receive an air filter. A cable tube connects to the two vertical frame members and provides cable access to and between the intermediate horizontal frame member and adjacent cabinets while maintaining cable shielding integrity.

The present invention provides various technical advantages over conventional telecommunications enclosure designs. For example, one technical advantage is to provide a cabinet that incudes electromagnetic interference and seismic environment protection. Another technical advantage is to provide a cabinet with an internal cable tube that maintains cable shielding integrity. Yet another technical advantage is to provide a cabinet with slidably removable air filters. Other technical advantages are readily apparent to those skilled in the art from the following figures, description, and claims.

BRIEF DESCRIPTION OF THE INVENTION

For a more complete understanding of the present invention and the advantages thereof, reference is now made to the following description taken in conjunction with the accompanying drawings, wherein like reference numerals represent like parts, in which:

FIG. 1 illustrates a perspective view of a cabinet for housing electronic equipment;

FIGS. 2A–C illustrate rear, side, and front views of the cabinet;

FIGS. 3A–E illustrate sectional views of the cabinet;

FIGS. 4A–B illustrate perspective views of vertical frame members for the cabinet;

FIG. 5 illustrates a perspective view of an upper horizontal frame member for the cabinet;

FIGS. 6A–C illustrate perspective views of sliding flanges for the upper horizontal frame member;

Figure 9B:
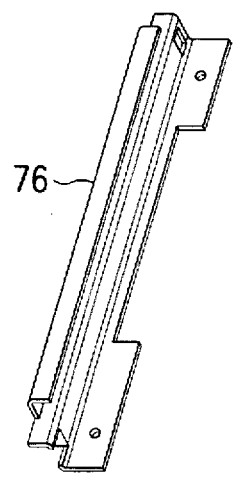
Figure 9A:
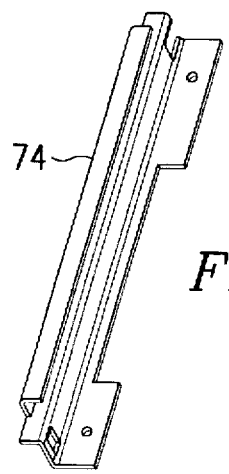
Figure 9C:
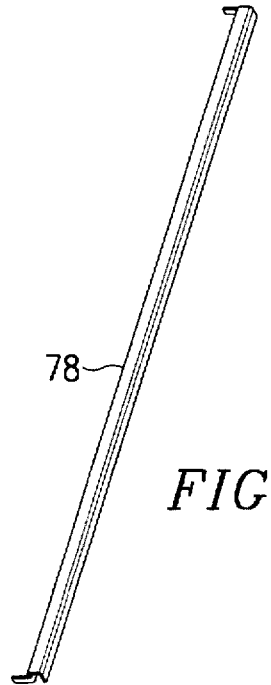
Figure 10A:
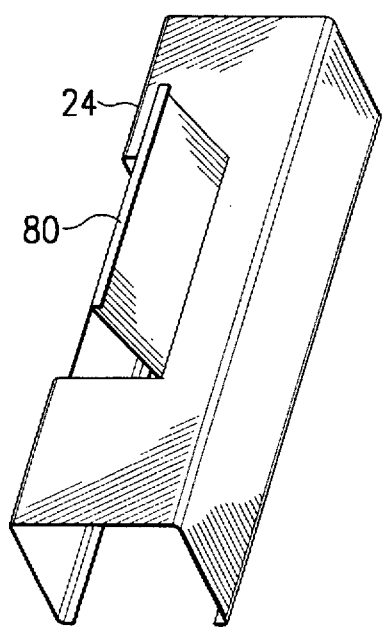
Figure 10B:
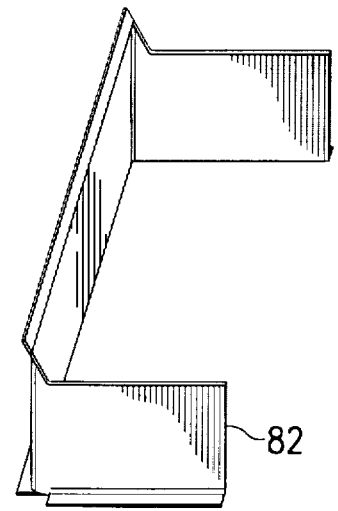
Figure 11:
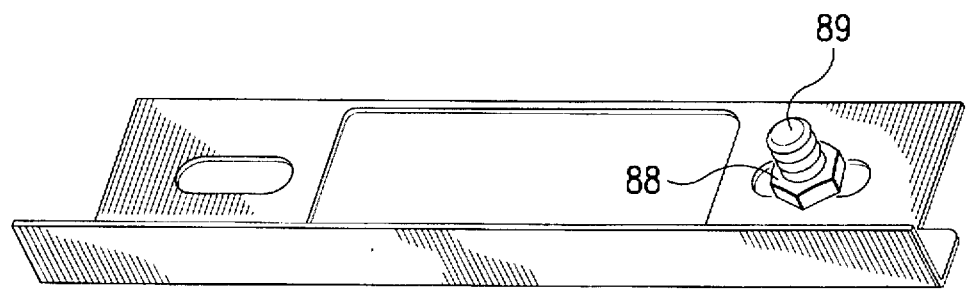
Figure 12A:
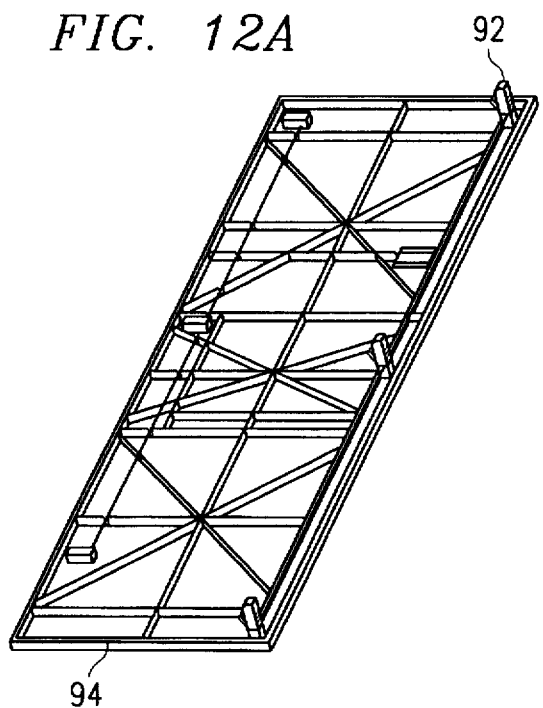
Figure 12B:
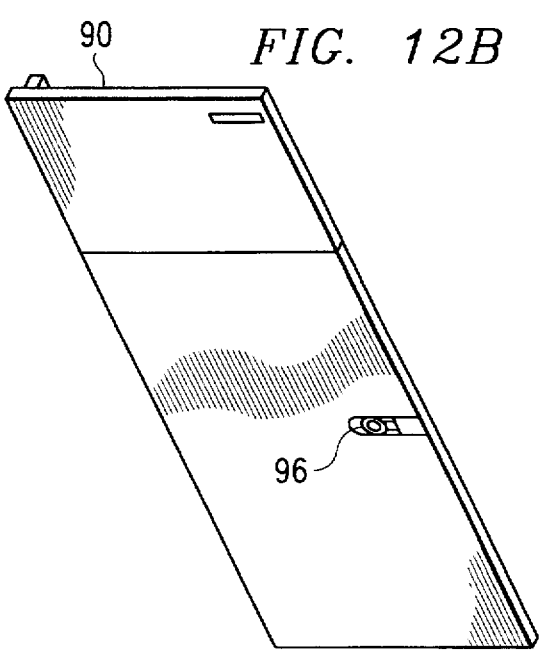
Figure 13A:
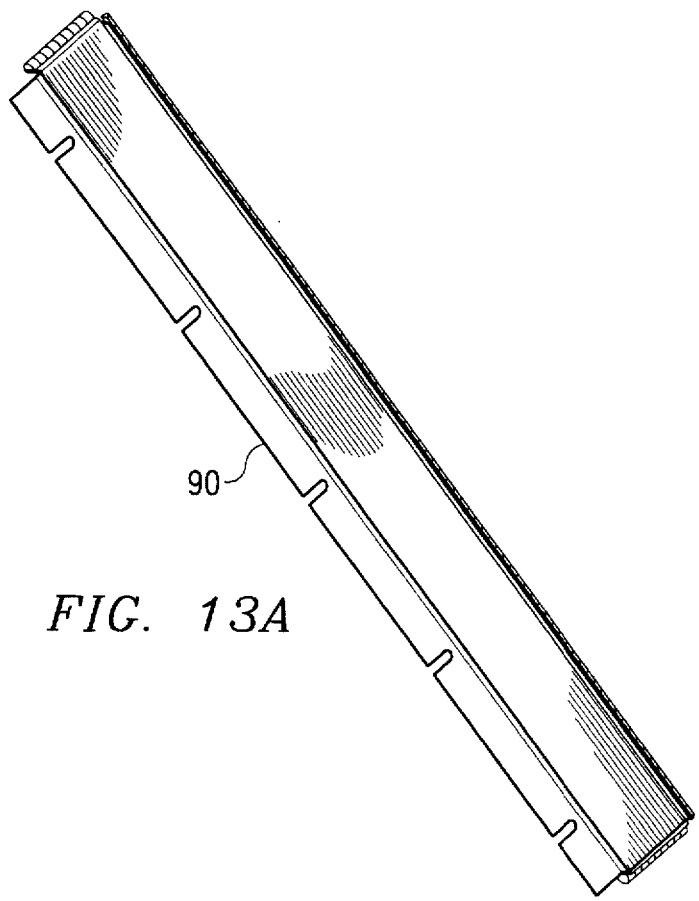
Figure 13B:
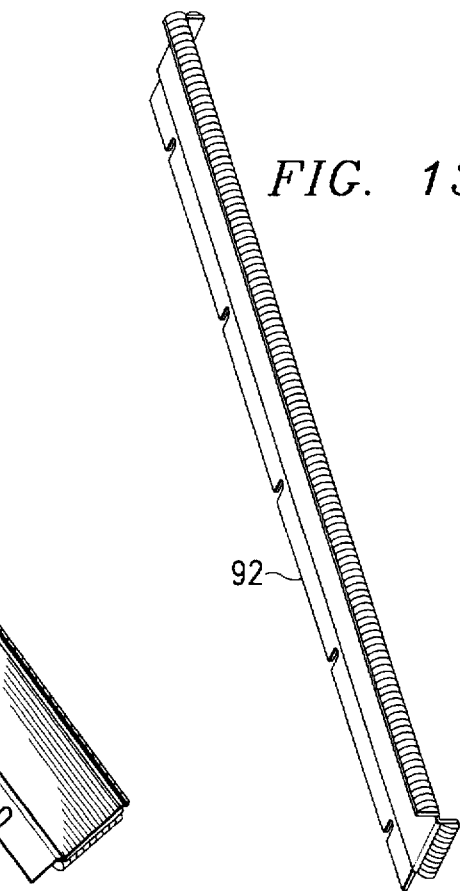
Figure 14B:
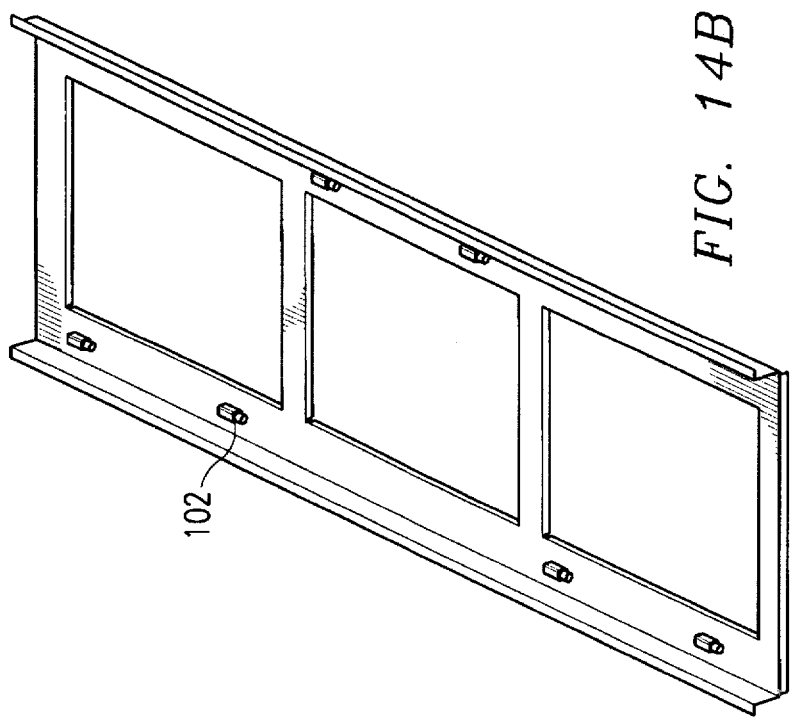
Figure 14A:
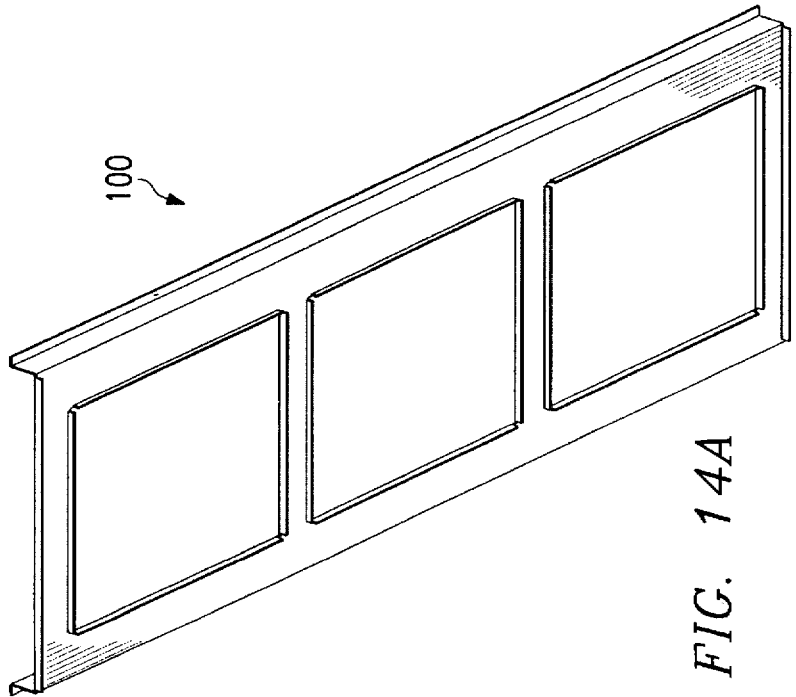

FIGS. 9A–C illustrate perspective views of sliding flanges for the intermediate horizontal frame member;

FIGS. 10A–B illustrate perspective views of cable tube components for the cabinet;

FIG. 11 illustrates a perspective view of a channel support for the cabinet;

FIGS. 12A–B illustrate perspective views of a door panel for the cabinet;

FIGS. 13A–B illustrate perspective views of door panel fillers for the cabinet;

FIGS. 14A–B illustrate perspective views of an intermediate door frame for the cabinet;

FIGS. 15A–B illustrate perspective views of an intermediate door panel for the intermediate door frame; and FIG. 16 illustrates a perspective view of an air intake for the cabinet.

DETAILED DESCRIPTION OF THE INVENTION

Figure 1:
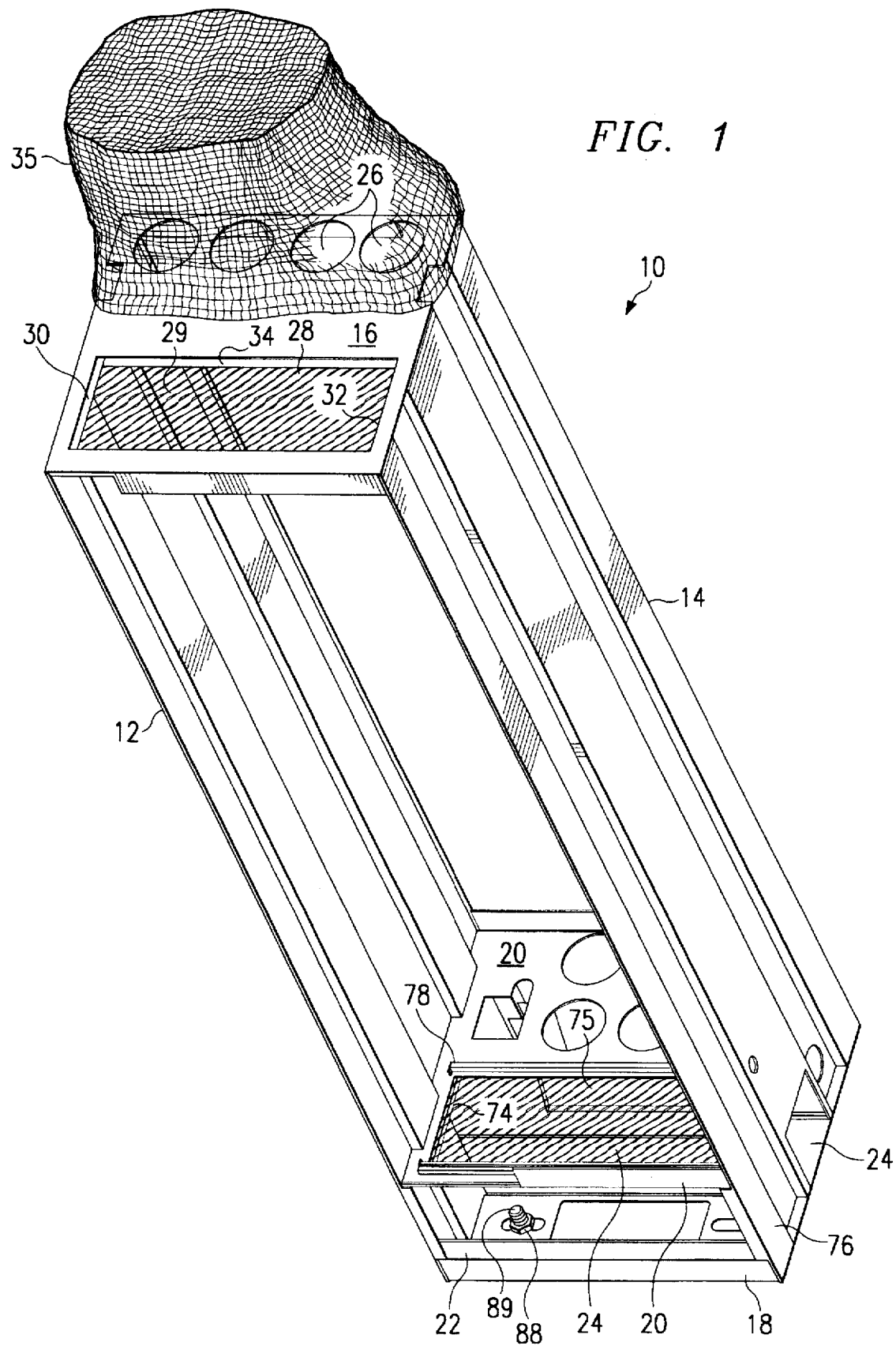

FIG. 1 illustrates a perspective view of a cabinet 10 for housing electronic equipment. Cabinet 10 includes a first vertical frame member 12 and a second vertical frame member 14 connected to an upper horizontal frame member 16, a lower horizontal frame member 18, and an intermediate horizontal frame member 20. A channel support 22 and a cable tube 24 are connected between first vertical frame member 12 and second vertical frame member 14.

Figure 2A:
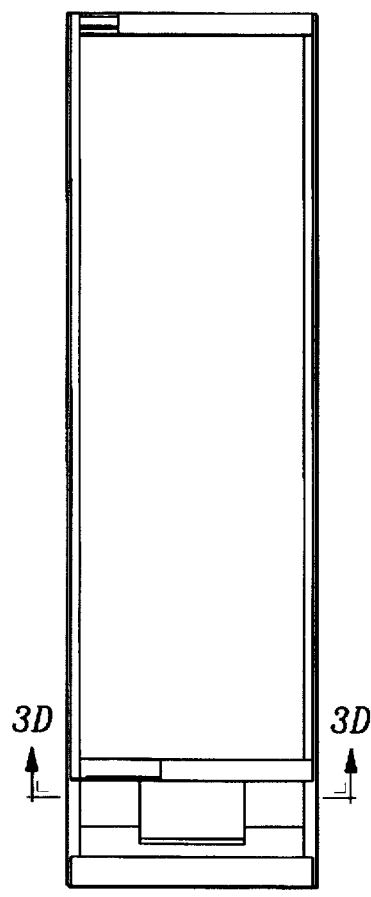
Figure 2B:
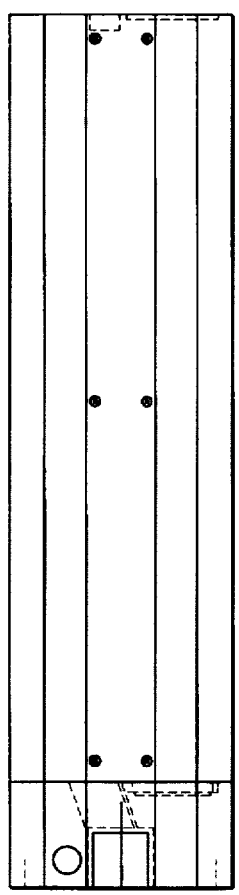
Figure 2C:
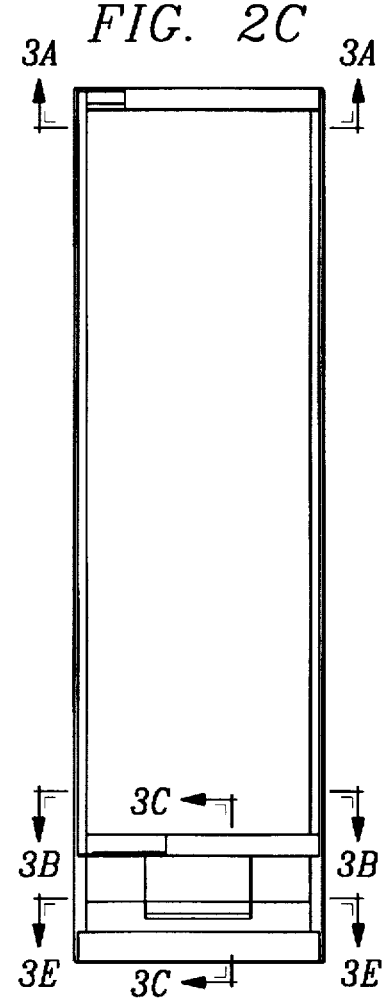
Figure 3A:
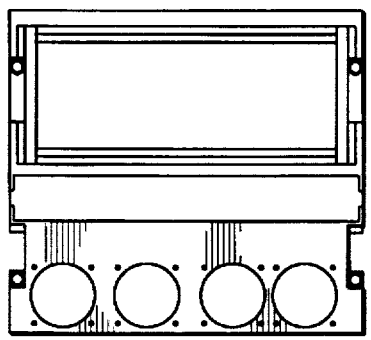
Figure 3C:
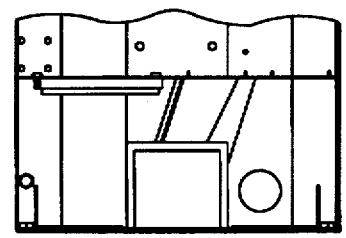
Figure 3B:
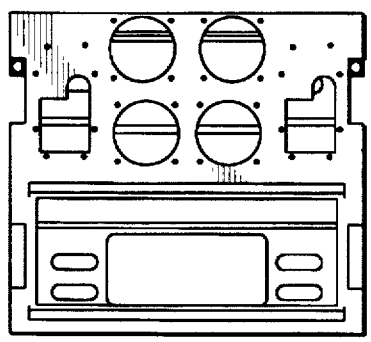
Figure 3D:
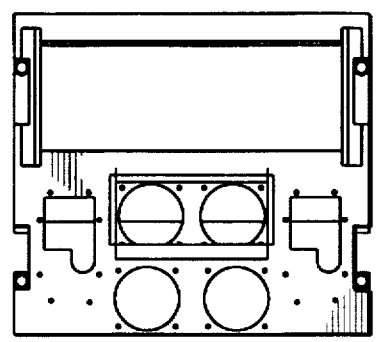
Figure 3E:
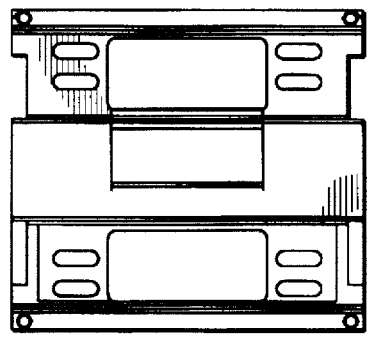

FIGS. 2A–C illustrate rear, side, and front views of cabinet 10. Cabinet 10 has a generally rectangular shape. The external dimensions for cabinet 10 meet international requirements while still providing the ability to house electronic equipment according to either domestic or international standards. Cabinet 10 is designed to provide optimum electromagnetic interference shielding for electronic equipment housed therein and for cables routed to, from, and within cabinet 10. FIGS. 3A–E illustrate additional sectional views of cabinet 10.

FIGS. 4A–B illustrate perspective views of first vertical frame member 12 and second vertical frame member 14 for cabinet 10. Both first and second vertical frame members 12 and 14 include outer flanges 50 for supporting outer door panels and inner flange sections 52 for supporting electronic equipment brace attachments and inner door frames. An aperture 54 provides access for cable tube 24.

Figure 5:
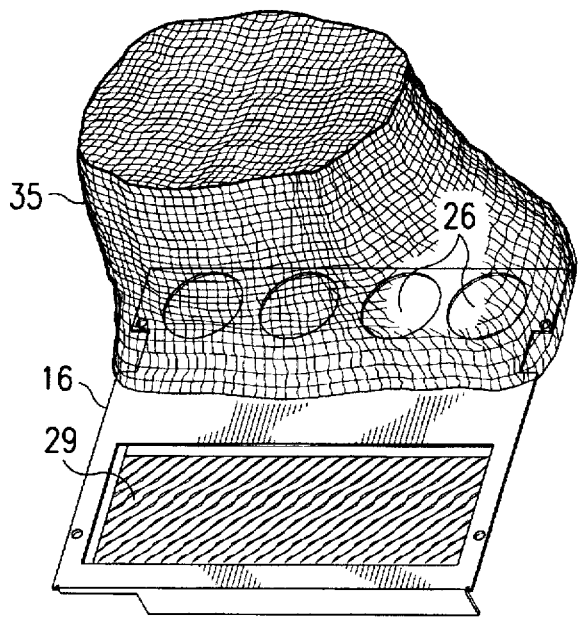
Figure 6B:
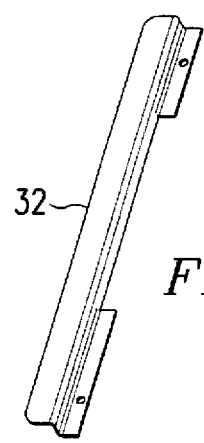
Figure 6A:
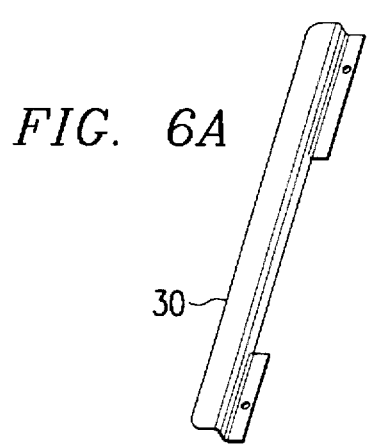
Figure 6C:
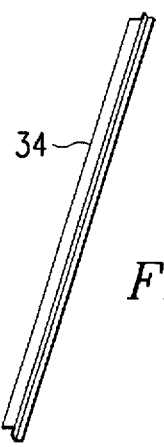

FIG. 5 illustrates a perspective view of upper horizontal frame member 16. Upper horizontal frame member 16 includes input/output ports 26 and an air filter recess 28. Input/output ports 26 receive external cabling for signals entering and leaving cabinet 10. Air filter recess 28 may retain a filter unit 29, for example a honeycomb pattern waveguide device with electromagnetic interference shielding, that is slidably positioned into upper horizontal frame member 16. FIGS. 6A–C show sliding flanges 30, 32, and 34 that are connected to upper horizontal frame member 16 in order to receive the filter unit 29. A filter assembly may be positioned beneath air filter recess 28 and the filter unit 29 to provide the desired air filtration. Upper horizontal frame member 16 may also include a zipper tube mesh enclosure 35 connected at input/output ports 26 to provide external electromagnetic interference shielding for cables entering and leaving cabinet 10. Input/output ports 26 may be blocked off by a shield plate when not in use.

Figure 7:
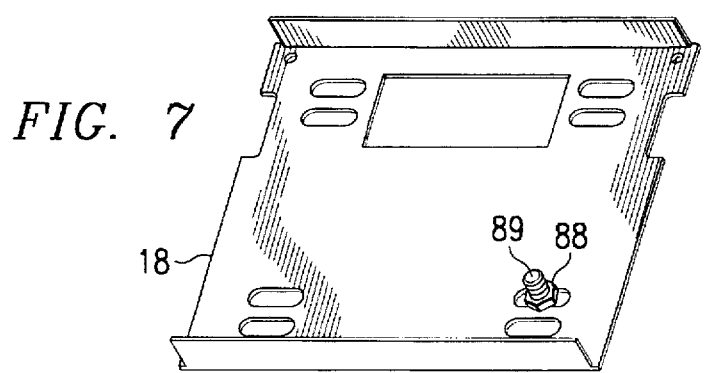
FIG. 7 illustrates a perspective view of a lower horizontal frame member for the cabinet.

FIG. 7 illustrates a perspective view of lower horizontal frame member 18. Lower horizontal frame member 18 includes apertures 60 for receiving mounting brackets 88 and leveling screws 89 as desired for installing cabinet 10. Lower horizontal frame member 18 in conjunction with channel support 22 provides protection against seismic activity affecting cabinet 10. Lower horizontal frame member 18 has a reinforced base and welded structures for seismic protection.

Figure 8:
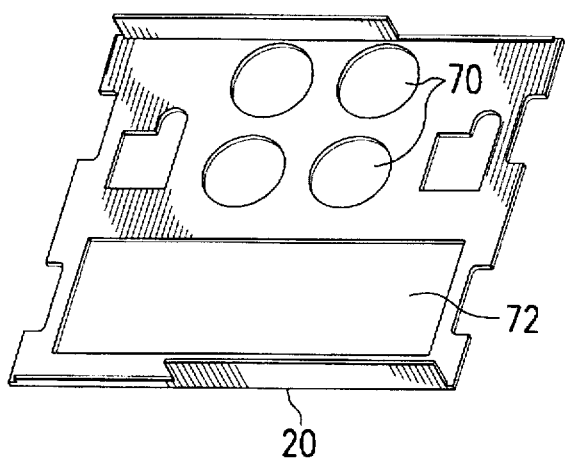
FIG. 8 illustrates a perspective view of an intermediate horizontal frame member for the cabinet.

FIG. 8 illustrates a perspective view of intermediate horizontal frame member 20. Intermediate horizontal frame member 20 includes integrated ports 70 to provide internal cable routing within cabinet 10. Intermediate horizontal frame member 20 also includes an air filter recess 72. Air filter recess 72 may retain a filter unit 75, for example a honeycomb pattern waveguide device with electromagnetic interference shielding, that is slidably positioned into intermediate horizontal frame member 20. FIGS. 9A–C show sliding flanges 74, 76, and 78 that are connected to intermediate horizontal frame member 20 in order to receive the filter unit 75. A filter assembly may be positioned beneath air filter recess 72 and the filter unit 75 to provide the desired air filtration.

FIG. 10A–B illustrate perspective views of cable tube 24 components. Cable tube 24 provides cable access to and between integrated ports 70 of intermediate horizontal frame member 20 and adjacent cabinets. Cable tube 24 maintains the cable shielding integrity to allow cables to pass from one cabinet 10 to another cabinet 10 without being exposed to electromagnetic interference. A flap 80 provides an opening into cable tube 24 to allow cables to be routed from integrated ports 70 to other cabinets and internally within cabinet 10. An enclosure 82 provides further shielding for cables between integrated ports 70 and cable tube 24. Electromagnetic interference gaskets may be installed at the openings of cable tube 24 for further shielding and protection.

FIG. 11 illustrates a perspective view of channel support 22. Channel support 22 connects to lower horizontal frame member 18 and provides support for an air intake ramp and seismic support for cabinet 10. Channel support 22 includes apertures to accept mounting bolts 88 and leveling screws 89 used to install cabinet 10 through lower horizontal frame member 18.

FIGS. 12A–B illustrate perspective views of a door panel 90 for cabinet 10. Door panel 90 includes a hinge assembly 92 that allows door panel 90 to open over a substantially one hundred and eighty degree arc. Door panel 90 includes electromagnetic interference gaskets 94 all around its edges. A latching assembly 96 allows for door panel 90 to be secured to cabinet 10. A door panel filler 98 shown in FIGS. 13A–B may be used to provide additional electromagnetic interference protection for cabinet 10.

FIGS. 14A–B illustrate perspective views of an intermediate door frame 100 for cabinet 10. Intermediate door frame 100 includes a hinge assemblies 102 for receiving an intermediate door panel 104 as shown in FIGS. 15A–B. Intermediate door frame 100 preferably attaches to first and second vertical frame members 12 and 14 at inner flange sections 52. Intermediate door panel 104 includes hinge receptacles 106 for coupling to hinge assemblies 102 of intermediate door frame 100. Mounting studs 108 provide for attachment to an electronic interface board. Apertures 110 provide for ports that can be connected and reconnected to the electronic interface board without exposing electronic equipment to an electromagnetic interference environment. The use of ports allow the electronic equipment to remain covered and shielded from electromagnetic interference. Electromagnetic interference gaskets 112 around intermediate door panel 104 provide shielding for electronic equipment within cabinet 10. All door frames and door panels may be coated with electromagnetic interference damping materials.

FIG. 16 illustrates a perspective view of an air intake 120 for cabinet 10. Air intake 120 slides between channel support 22 and intermediate horizontal frame member 20 beneath air filter recess 72. Air intake 120 slides out and away from cabinet 10 to provide access to mounting bolts 88 and leveling screws 89 at lower horizontal frame member 18. Air intake 120 has a cosmetic shape to provide an attractive appearance to cabinet 10.

Thus, it is apparent that there has been provided, in accordance with the present invention, a cabinet for housing electronic equipment that satisfies the advantages as set forth above. Although the preferred embodiment has been described in detail, it should be understood that various changes, substitutions, and alterations readily ascertainable by those skilled in the art can be made herein without departing from the spirit and scope of the present invention as defined by the following claims.

What is claimed is:

1. A cabinet for housing electronic equipment, comprising:

two vertical frame members;

upper and lower horizontal frame members connected to the two vertical frame members to form a generally rectangular frame, the upper horizontal frame member having input and output ports to provide for external connections to cables, the upper horizontal frame member having a recess to slidably receive an air filter, the lower horizontal frame member including reinforced joints to provide seismic protection;

an intermediate horizontal frame member connected to the two vertical frame members, the intermediate horizontal frame member having integrated ports to provide internal cable routing, the intermediate horizontal frame member having a recess to slidably receive another air filter;

a cable tube connected to the two vertical frame members, the cable tube providing cable access between the intermediate horizontal frame member and adjacent cabinets while maintaining cable shielding integrity.

2. The cabinet of claim 1, further comprising:

an air intake ramp slidably mounted to the lower frame member and the intermediate frame member, the air intake ramp being positioned beneath the recess of the intermediate frame member.

3. The cabinet of claim 2, wherein the air intake ramp is removable to allow access to mounting bolts and leveling screws of the lower frame member.

4. The cabinet of claim 1, further comprising:

front and back door panels connected to one of the two vertical frame members, the front and back door panels providing electromagnetic interference shielding for the electronic equipment.

5. The cabinet of claim 4, wherein the front and back door panels are internally coated with an electromagnetic interference damping material.

6. The cabinet of claim 4, wherein the front and back door panels are mounted on hinges that allow the front and back door panels to swing through a one hundred and eighty degree arc.

7. The cabinet of claim 1, further comprising:

an intermediate door panel connected internally to one of the two vertical members, the intermediate door panel including a plurality of ports to provide connections to and between the electronic equipment without exposing the electronic equipment to electromagnetic interference.

8. The cabinet of claim 1, further comprising:

a zipper tube mesh enclosure connected to the upper frame member to provide electromagnetic interference shielding for the cables entering and leaving the cabinet.

* * * * *